United States Patent
Rauchfuss

(10) Patent No.: US 7,701,175 B2
(45) Date of Patent: Apr. 20, 2010

(54) METHOD FOR DETECTING ACID STRATIFICATION IN A BATTERY

(75) Inventor: Lutz Rauchfuss, Schwieberdingen (DE)

(73) Assignee: Robert Bosch GmbH, Stuttgart (DE)

( * ) Notice: Subject to any disclaimer, the term of this patent is extended or adjusted under 35 U.S.C. 154(b) by 828 days.

(21) Appl. No.: 10/552,859

(22) PCT Filed: Mar. 17, 2004

(86) PCT No.: PCT/DE2004/000533

§ 371 (c)(1),
(2), (4) Date: Nov. 6, 2006

(87) PCT Pub. No.: WO2004/092757

PCT Pub. Date: Oct. 28, 2004

(65) Prior Publication Data

US 2007/0065713 A1    Mar. 22, 2007

(30) Foreign Application Priority Data

Apr. 11, 2003   (DE) ................. 103 16 638

(51) Int. Cl.
*H02J 7/00* (2006.01)
(52) U.S. Cl. ...................... 320/132; 324/432
(58) Field of Classification Search ................ 320/132; 324/427, 432; 702/63
See application file for complete search history.

(56) References Cited

U.S. PATENT DOCUMENTS

| | | | | |
|---|---|---|---|---|
| 6,441,586 B1 * | 8/2002 | Tate et al. | ................... | 320/132 |
| 6,534,954 B1 * | 3/2003 | Plett | ........................... | 320/132 |
| 6,965,216 B2 * | 11/2005 | Pavlovic et al. | ............. | 320/157 |
| 2002/0101243 A1 * | 8/2002 | Mentgen et al. | ............. | 324/427 |
| 2003/0052646 A1 * | 3/2003 | Minamiura et al. | ......... | 320/122 |
| 2003/0146737 A1 * | 8/2003 | Kadouchi et al. | ........... | 320/132 |

FOREIGN PATENT DOCUMENTS

DE    101 06 508    8/2002

OTHER PUBLICATIONS

DesMettre D. et al; "Experimental Study of Stratification Of Electrolyte In Lead/Acid Batteries Used For Solar Energy"; Jul. 6-10, 1998.
Mattera F. et al; "Characterisation Of Photovoltaic Batteries using Radio Element Detection: The Influence And Consequences Of The Electrolyte Stratification"; Jan. 27, 2003.
Newman R. H. et al.; "New Operational Strategies for Gelled-Electrolyte Lead/Acid Batteries"; Mar. 4, 1996.
Chao C. W. et al.; "Continuous Monitoring Of Acid Stratification During Charge/Discharge By Holographic Laser Interferometry"; Jun. 1, 1995.

* cited by examiner

*Primary Examiner*—Edward Tso
*Assistant Examiner*—Arun Williams
(74) *Attorney, Agent, or Firm*—Kenyon & Kenyon LLP

(57) ABSTRACT

A method for detecting acid stratification in a battery includes the following steps:
  determining a first state of charge value during a load period of the battery on the basis of an estimated open-circuit voltage,
  determining a second state of charge value during a rest period of the battery following the load period on the basis of a measured open-circuit voltage,
  comparing the first state of charge value to the second state of charge value, and
  detecting acid stratification when a defined deviation of the first state of charge value from the second state of charge value is exceeded.

14 Claims, No Drawings

METHOD FOR DETECTING ACID STRATIFICATION IN A BATTERY

BACKGROUND INFORMATION

In modern motor vehicles, the energy storages for supplying safety-critical electrical consumers, e.g., break-by-wire, steer-by-wire, start-stop systems, or electrohydraulic brake systems, must be constantly monitored and their performance must be tested. An electronic battery management system monitors the performance of the batteries, thereby decisively supporting the demand-oriented control of the vehicle systems. A variable, significant for the performance capacity of a battery, is its state of charge (SOC). Based on the SOC value and the SOH value (state of health), a decision is made as to whether pure comfort functions such as air conditioner, radio, or power windows are to be switched off or whether other measures have to be taken in order to maintain safety-relevant functions such as ABS, ESP, or the brake booster.

Different methods for forecasting the performance of batteries are known from the related art. Variables, significant for the performance capacity of the batteries, such as the state of charge and the battery-internal resistance, for example, are determined by analyzing the open-circuit voltage, as well as via voltage and current measurements during start, or via model-based state observation under continuous measurement of voltage, current, and temperature, and a power output of the battery to be expected is predicted using these variables. Such a model-based method is known from German Patent Application No. DE 101 06 508. Among other things, the state of charge SOC is continuously estimated during vehicle operation or determined on the basis of an estimated open-circuit voltage of the battery.

During rest periods, in which the battery is essentially off-load, the open-circuit voltage is measured and used to draw conclusions about the state of charge (SOC).

Problematic is the occurring acid stratification in the battery. During charging, of a lead-sulfuric acid battery for example, the sulfuric acid emerging on the plates is heavier than the surrounding diluted sulfuric acid so that it sinks into the lower part of the battery due to gravitation. Therefore, during rest periods without electrolyte movement, the acid density is reduced in the upper part of the battery and increased in the lower part of the battery. This results in a sulfuric acid density gradient, which is known as acid stratification. The acid stratification should not be maintained permanently, because it results otherwise in irreversible damage to the battery. Another disadvantage of acid stratification is the fact that open-circuit voltages are measured to be too high in the rest period so that states of charge (SOC values) are determined to be too high. Consequently, the instantaneous state of the battery is evaluated too optimistically so that the vehicle containing the battery is possibly no longer able to be started, even though the state of charge has been previously determined to be sufficiently high.

DETAILED DESCRIPTION

One advantage of the present invention is the fact that the acid stratification may be detected in time and a misevaluation of the state of charge during the rest period of a battery may be prevented. Furthermore, it is advantageous that suitable measures may be taken when acid stratification is detected, in order to make a correct forecast of the battery's performance and to reduce the acid stratification.

According to the present invention, these advantages are achieved by a method for: detecting acid stratification in a battery including the following steps:

Determining a first state of charge value ($SOC_1$) during a load period of the battery on the basis of an estimated open-circuit voltage, Determining a second state of charge value ($SOC_2$) during a rest period following the load period on the basis of a measured open-circuit voltage, Comparing the first state of charge value ($SOC_1$) to the second state of charge value ($SOC_2$), and Detecting acid stratification when a defined deviation ($\Delta SOC$) of the first state of charge value ($SOC_1$) from the second state of charge value ($SOC_2$) is exceeded.

The open-circuit voltage, estimated during the load period, is based on a model describing the battery and is less influenced by the acid stratification, in particular at low states of charge. In contrast, the measured open-circuit voltage during the rest period is dependent on acid stratification. If the two SOC values, determined on the basis of these open-circuit voltages, differ by more than the defined deviation, acid stratification is pinpointed as the cause of this difference.

A rest period, during which an open-circuit voltage measurement and an open-circuit voltage extrapolation take place, is normally defined in such a way that the closed-circuit current (discharge current of the battery) is less than a specified limiting value. A period, during which the current is greater than a limiting value, qualifies as the load period during which an evaluation of the open-circuit voltage is carried out via a model or an SOC correction.

In the method according to the present invention, the battery is an acidic battery used for supplying voltage to a motor vehicle in particular. The battery may be a lead-sulfuric acid battery for example.

In a preferred embodiment of the present invention, the deviation of the two determined SOC values, indicating acid stratification upon being exceeded, is defined as >20%.

In a preferred embodiment of the present invention, the estimated open-circuit voltage is determined using an observation device, a Kalman filter in particular, the Kalman filter estimating the open-circuit voltage on the basis of a measured battery voltage and/or a measured battery temperature and/or a measured battery current utilizing a model describing the battery. With the aid of the Kalman filter, the state of charge, determined too high due to acid stratification, is detected at states of charge <50% and is corrected toward lower SOC values. The underlying model is an electrical equivalent circuit diagram describing the battery. The Kalman filter normally calculates the terminal voltage of the battery using the model, compares it to the measured value, and then corrects the model until the measured value and the estimated value match.

Moreover, an object of the present invention is a method for determining the state of charge of a battery during a rest period including the following steps:

Detecting acid stratification according to the above-described method according to the present invention, Adopting the first state of charge value ($SOC_1$) for the rest period when the defined deviation ($\Delta SOC$) of the first state of charge value ($SOC_1$) from the second state of charge value ($SOC_2$) is exceeded.

Given acid stratification, the first state of charge value, which is evaluated during the load period on the basis of a model, is lower than an SOC value determined during the instantaneous rest period on the basis of the measured open-circuit voltage. By using this lower SOC value also for the rest period, too high a state of charge is prevented from being assumed so that a timely response to an insufficient state of charge is possible.

Moreover, an object of the present invention is a method for neutralizing acid stratification in a battery including the following steps:

Detecting acid stratification according to the above-described method according to the present invention, Increasing a charging voltage, used for charging the battery, when the defined deviation ($\Delta SOC$) of the first state of charge value ($SOC_1$) from the second state of charge value ($SOC_2$) is exceeded.

As a result of the increase in the charging voltage, small gas bubbles are created in the electrolyte and ascend in the electrolyte to cause a mixture, thereby neutralizing the acid stratification. For neutralizing the acid stratification, the charging characteristic may be raised until the SOC differences between the rest periods and the load periods are smaller again. The advantage is that the forced aging of the battery due to higher charging voltages and acid stratification is temporary because the charging voltage is lowered again after the reduction of the acid stratification.

Furthermore, vibration of the battery (operation of the motor vehicle) and targeted electrolyte circulation are conceivable as alternative or additional countermeasures for acid stratification.

Another object of the present invention is the use of the method according to the present invention for detecting acid stratification and for determining the state of charge in a system for detecting the performance capacity of the battery. Due to the integration of the method according to the present invention into the computing routines of such a system, e.g., a control unit for detecting the battery condition and for electrical energy management, it is ensured that the state of charge of the battery is correctly determined, in spite of acid stratification. The electrical energy management system (EEM) regulates the entire electrical budget in a motor vehicle. A component of the electrical energy management system is the electrical battery management system (EBM). The EBM includes a warning signal which alerts the driver that possibly only a limited amount of electrical power is still available, e.g., for an electrohydraulic brake system. In addition, selected consumers are switched off via a relay or a CAN bus, if needed.

The methods according to the present invention are therefore preferably used in an electrical battery management system.

What is claimed is:

1. A method for detecting acid stratification in a battery, the method comprising:
    determining a first state of charge value during a load period of the battery based on an estimated open-circuit voltage;
    determining a second state of charge value during a rest period of the battery following the load period based on a measured open-circuit voltage;
    comparing the first state of charge value to the second state of charge value; and
    detecting acid stratification when a defined deviation of the first state of charge value from the second state of charge value is exceeded; and
    assuming the first state of charge value for the rest period when the defined deviation of the first state of charge value from the second state of charge value is exceeded.

2. The method according to claim 1, wherein the deviation is defined as >20%.

3. The method according to claim 1, further comprising:
    determining the estimated open-circuit voltage via an observation device, the observation device including a Kalman filter, the Kalman filter estimating the open-circuit voltage on the basis of at least one of a measured battery voltage, a measured battery temperature and a measured battery current using a model describing the battery.

4. The method according to claim 1, wherein the method is performed in a system for detecting a performance capacity of the battery.

5. The method according to claim 1, wherein the method is performed in an electrical battery management system.

6. A method for determining a state of charge of a battery during a rest period, the method comprising:
    detecting acid stratification by:
    determining a first state of charge value during a load period of the battery based on an estimated open-circuit voltage,
    determining a second state of charge value during a rest period of the battery following the load period based on a measured open-circuit voltage,
    comparing the first state of charge value to the second state of charge value, and
    detecting acid stratification when a defined deviation of the first state of charge value from the second state of charge value is exceeded; and
    assuming the first state of charge value for the rest period when the defined deviation of the first state of charge value from the second state of charge value is exceeded.

7. The method according to claim 6, wherein the method is performed in a system for detecting a performance capacity of the battery.

8. The method according to claim 6, wherein the method is performed in an electrical battery management system.

9. The method according to claim 6, wherein the deviation is defined as >20%.

10. The method according to claim 6, further comprising:
    determining the estimated open-circuit voltage via an observation device, the observation device including a Kalman filter, the Kalman filter estimating the open-circuit voltage on the basis of at least one of a measured battery voltage, a measured battery temperature and a measured battery current using a model describing the battery.

11. A method for neutralizing acid stratification in a battery, the method comprising:
    detecting acid stratification by:
    determining a first state of charge value during a load period of the battery based on an estimated open-circuit voltage,
    determining a second state of charge value during a rest period of the battery following the load period based on a measured open-circuit voltage,
    comparing the first state of charge value to the second state of charge value to define a deviation, and
    detecting acid stratification when the defined deviation of the first state of charge value from the second state of charge value is exceeded; and
    increasing a charging voltage for charging the battery when the defined deviation of the first state of charge value from the second state of charge value is exceeded; and
    assuming the first state of charge value for the rest period when the defined deviation of the first state of charge value from the second state of charge value is exceeded.

12. The method according to claim 11, wherein the method is performed in an electrical battery management system.

13. The method according to claim 11, wherein the deviation is defined as >20%.

14. The method according to claim 11, further comprising: determining the estimated open-circuit voltage via an observation device, the observation device including a Kalman filter, the Kalman filter estimating the open-circuit voltage on the basis of at least one of a measured battery voltage, a measured battery temperature and a measured battery current using a model describing the battery.

* * * * *